(12) United States Patent
Takanabe

(10) Patent No.: US 6,606,574 B2
(45) Date of Patent: Aug. 12, 2003

(54) QUALITY CONTROL METHOD FOR PRODUCT PRODUCTION APPARATUS

(75) Inventor: Naoko Takanabe, Tokyo (JP)

(73) Assignee: Mitsubishi Denki Kabushiki, Tokyo (JP)

(*) Notice: Subject to any disclaimer, the term of this patent is extended or adjusted under 35 U.S.C. 154(b) by 0 days.

(21) Appl. No.: 09/876,234

(22) Filed: Jun. 8, 2001

(65) Prior Publication Data
US 2002/0055194 A1 May 9, 2002

(30) Foreign Application Priority Data
Nov. 8, 2000 (JP) ........................................ 2000-340827

(51) Int. Cl.[7] ............................ H01L 21/66; G01R 31/26
(52) U.S. Cl. .......................................................... 702/84
(58) Field of Search ............................ 702/84, 81, 188; 700/110; 382/141; 356/237; 348/87; 395/183; 707/103; 250/358; 375/230

(56) References Cited

U.S. PATENT DOCUMENTS

| | | | | |
|---|---|---|---|---|
| 3,868,576 A | * | 2/1975 | Bagdasarjanz et al. | 375/230 |
| 5,015,856 A | * | 5/1991 | Gold | 250/339.09 |
| 5,262,966 A | * | 11/1993 | Shiihara | 702/188 |
| 5,696,686 A | * | 12/1997 | Sanka et al. | 700/110 |
| 5,909,504 A | * | 6/1999 | Whitman | 382/141 |
| 6,061,640 A | * | 5/2000 | Tanaka et al. | 702/81 |

FOREIGN PATENT DOCUMENTS

JP 9-50949 2/1997

* cited by examiner

Primary Examiner—John Barlow
Assistant Examiner—Tung S Lau
(74) Attorney, Agent, or Firm—Leydig, Voit & Mayer, Ltd.

(57) ABSTRACT

A method and system for quality control of a production line. Troubles with quality are prevented by detecting a trend in quality characteristics of the production line or fluctuations in an early stage. The absolute values of the differences between same kinds of the data obtained at given measurement points regarding quality control data or the absolute values of the differences between same items of one kind of SPC data are used as a controlled item for detecting a trend in quality control characteristics or fluctuations of the quality control characteristics. The differences between maximum and minimum values of the quality control data at measurement points within the same lot or within the same wafer are used as the differences between same kinds of the quality control data, for example.

3 Claims, 5 Drawing Sheets

(a)

(b)

(a) PATTERN A (b) PATTERN B (c) PATTERN C

PRIOR ART

QUALITY CONTROL METHOD FOR PRODUCT PRODUCTION APPARATUS

BACKGROUND OF THE INVENTION

1. Field of the Invention

The present invention relates to a quality control method and a quality control system on a production line for fabricating products including a series of lots such as semiconductor products and, more particularly, to quality control method and system on a production line that collect data by measurements or inspections of fabricating products derived by an arbitrary manufacturing process or manufacturing equipment and monitor the quality characteristics of fabricating products associated with the results of the processing to thereby prevent troubles with quality.

2. Description of the Related Art

A semiconductor production line is made up of processing steps such as formation of films and photoengraving and inspection steps such as inspection of film thicknesses and inspection of development. To stabilize the quality and to improve the productivity, it is essential to establish a method of managing the quality of fabricated products. In recent years, a quality control method using a database and providing concentrated management of products has generally been established. In particular, the database is created by collecting various kinds of data including data about actual results (such as lot names, process step names, product types, and date of completion), data obtained by actual measurements or inspections of the characteristics of lots undergone processing performed by an arbitrary process step or manufacturing apparatus, statistical data obtained by statistically processing the aforementioned kinds of data, data about the equipment (such as process conditions and maintenance), and data about electric power and energies (such as blackout, stoppage of water supply, and power supplied to an air conditioner). In this prior art method, data obtained by actual measurements or inspections of individual lots are monitored such that the average values of the measured data do not exceed preset threshold values. If any one of the average values exceeds the threshold value, it is determined that an abnormality has taken place, and an alarm is issued. The associated section of the plant will search for the cause and take measures.

A specific example of method of judging an abnormality is proposed, for example, in Japanese Patent laid-open No. Hei. 9-50949 using a computer for monitoring production and quality in a production management and computational system. This computer employs three decision patterns A, B, and C as shown in FIG. 4. In this figure, $C_V$ indicates the centerline of data used as a reference for control. Lines $L_U$ and $L_L$ indicate an upper threshold value and a lower threshold value, respectively. Values obtained by actual measurements such as average values of actual measurements are indicated by small black circles P. The pattern A of FIG. 4(a) indicates a case in which actually obtained values P, such as some average values of actual measurements, are higher than the upper threshold $L_U$ of the data used as a reference for quality control and other average values P are lower than the lower threshold $L_L$ thereof The pattern B of FIG. 4(b) indicates a case in which successively obtained actual values P are all at one side of the center value $C_V$ of the data used as a reference for quality control. The pattern C of FIG. 4(c) indicates a case in which actually obtained values P are all at an angle in succession to the center value $C_V$ of the data used as a reference for quality control. These cases are judged to be abnormal. FIG. 5 shows the transition of the average value of measured dimensions. This transition is judged to be abnormal from the pattern C described above.

In the prior art quality control method described above, statistical data consisting of average values of measurements has been mainly monitored to judge whether the quality characteristics of fabricated products are abnormal. If the average value of measurements goes over the upper threshold value for the control or goes under the lower threshold value, the lot has often already become defective. Therefore, it has been difficult to prevent troubles with quality or equipment. Furthermore, if quality trouble due to a cause that is difficult to find takes place, the equipment or lot is stopped for a long time. This deteriorates productivity. In addition, as proposed in the above-cited Japanese Patent laid-open No. Hei. 9-50949, in order to grasp a phenomenon in which average values of measured dimensions are at an angle in succession, the average values of measurements of plural lots are necessary (8 lots in the case of FIG. 5). This delays taking measures against the trouble. As a result, many defective lots are produced, increasing the damage.

SUMMARY OF THE INVENTION

The present invention has been made to solve the foregoing problems.

It is an object of the present invention to provide a quality control method of preventing troubles with quality by detecting the trendency or fluctuations of quality characteristics of products fabricated on a production in early stage.

It is another object of the invention to provide a quality control system that implements the quality control method described in the immediately preceding paragraph.

According to the present invention, a quality control method on a production line including at least one fabricating step for fabricating products including a series of lots, said quality control method comprising:

a inspection step for inspecting the fabricating products associated with results of the fabrication step of line;

a storing step for storing data obtained by the inspection step to a memory; and a management step for managing the variations of the data to manage the quality characteristics of the fabricating products by using the data stored in the memory;

wherein in the management step, the trend in quality is managed by using absolute values of differences between same kinds of the data obtained at given measurement points regarding each of the fabricating products.

In one feature of the quality control method on the production line, wherein in the management step, the trend in quality is managed by using absolute values of differences between maximum and minimum values of same kinds of the data obtained at given measurement points regarding each lot of the fabricating products.

In another feature of the quality control method on the production line, wherein in the management step, the trend in quality is managed by using absolute values of differences between same kinds of the data obtained at given measurement points regarding each of the fabricating products, based on a threshold value and wherein if any one of the absolute values of differences exceeds the threshold value, an alarm is issued.

According to the invention, another quality control method on a production line including at least one fabricating step for fabricating products including plural groups of a series of lots, said quality control method comprising:

a inspection step for inspecting the fabricating products associated with results of the fabrication step;

a storing step for storing data obtained by the inspection step to a memory;

a processing step for statistically processing the data stored in the memory to thereby derive statistical data; and a management step for managing the variations of the statistical data to manage the quality characteristics of the fabricating products;

wherein in the management step, the trend in quality is managed by using absolute values of differences between same items of the statistical data derived from the two groups of the series of lots processed by the fabricating step in succession.

In a still feature, the quality control method on the production line, wherein in the management, the trend in quality is managed by using the values of differences between average values derived from the two groups of the series of lots processed by the fabricating step in succession.

In a another feature, the quality control method on the production line, wherein in the management step, the trend in quality is managed by using absolute values of differences between same items of the statistical data derived from the two groups of the series of lots processed by the fabricating step in succession, based on a threshold value and wherein if any one of the values of differences exceeds the threshold value, an alarm is issued.

In the quality control method for a production line for fabricating products in accordance with the present invention, a trend in quality of the series of products is managed, using either absolute values of differences between same kinds of the data obtained at given measurement points regarding each of fabricating products, or absolute values of differences between same items of the statistical data derived from the two groups of the series of lots processed by the fabricating step in succession. Consequently, troubles with quality can be prevented. Hence, the quality of the products can be stabilized. Also, the productivity can be enhanced.

According to the invention, a quality control system on a production line including plural fabricating steps for fabricating products including a series of lots, said quality control system comprising:

a quality characteristic data registration-and-processing means for storing data about actual results obtained by inspecting the fabricating products processed by the fabricating steps to a memory, said results including lot name of the products, process step name, product type, and date of processing;

a management condition registration-and-processing means registered with a method of judging whether each lot is defective and with an upper threshold value, a lower threshold value, and a processing method effected when an abnormality takes place;

a quality characteristic abnormality decision means for receiving data about results of inspections on the fabricating products from quality characteristic data registration-and-processing means, and judging the data obtained by the inspections based on the abnormality decision method registered in the management condition registration-and-processing means; and a notice-and-display means for giving a notice of results of a decision made by the quality characteristic abnormality decision means and displaying the results;

wherein said quality characteristic abnormality decision means acting to manage a trend in quality of said fabricating products, using absolute values of differences between same kinds of the data obtained at given measurement points regarding each of the lots.

Also, according to the invention, a quality control system on a production line including plural fabricating steps for fabricating products including plural groups of a series of lots, said quality control system comprising:

a quality characteristic data registration-and-processing means for storing data about results and data obtained by inspecting the fabricating products processed by the fabricating steps to a memory and for statistically processing the date to obtain statistical data, said results including lot name of the products, process step name, product type, and date of processing;

a management condition registration-and-processing means registered with a method of judging whether each lot is defective and with an upper threshold value, a lower threshold value, and a processing method effected when an abnormality takes place;

a quality characteristic abnormality decision means for receiving data about the results of inspections on the fabricating products and said statistical data from said quality characteristic data registration-and-processing means, and judging the statistical data by the abnormality decision method registered in said management condition registration-and-processing means; and a notice-and-display means for giving a notice of results of a decision made by the quality characteristic abnormality decision means and displaying the results;

wherein said quality characteristic abnormality decision means acting to manage a trend in quality of said groups of series of lot, using absolute values of differences between the same items of said statistical data derived from the two groups of the series of lots processed by same fabricating step in succession.

In the quality control system for a production line for fabricating products in accordance with the present invention, a trend in quality of the series of products is managed, using either absolute values of differences between same kinds of the data obtained at given measurement points regarding each of fabricating products, or absolute values of differences between same items of the statistical data derived from the two groups of the series of lots processed by the fabricating step in succession. Therefore, troubles with quality can be prevented. In consequence, the quality of the products can be stabilized. Also, the productivity can be improved.

Other objects and features of the invention will appear in the course of the description thereof, which follows.

DESCRIPTION OF THE PREFERRED EMBODIMENTS

Embodiment 1

Figure 1:
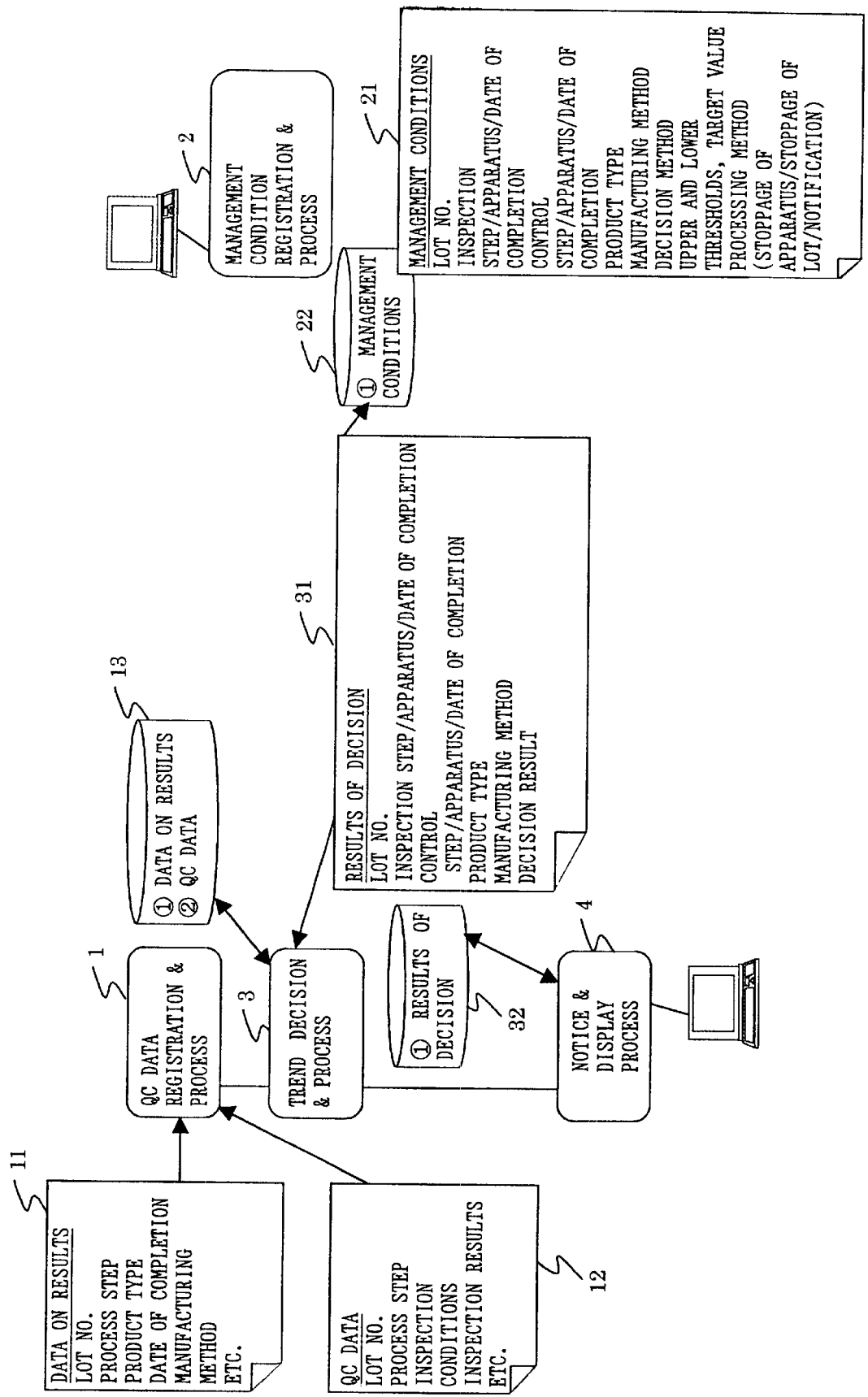
FIG. 1 is a block diagram of a quality control trend management system in accordance with Embodiment 1 of the present invention.

Embodiments of the present invention are hereinafter described by referring to accompanying drawings. FIG. 1 is a block diagram showing the structure of a quality control trend management system on a production line including plural fabricating steps that fabricates semiconductor devices in accordance with Embodiment 1 of the present invention. This quality control trend management system is especially adapted to manage a trend in quality characteristics or fluctuations. The quality control trend management system in accordance with the present embodiment comprises a quality control data registration-and-processing means 1, a management condition registration-and-processing means 2, a trend decision-and-processing means 3, and a notice-and-display processing means 4. The quality control data registration-and-processing means 1 collects data 11 about actual results and data 12 obtained by actual measurements or actual inspections about quality characteristics obtained by inspection steps and stores these kinds of data in a storage means 13. The data 11 about the actual results are often referred to as "actual result data" herein, and include lot numbers (lot Nos.), process step names, product types, and dates of completion. The data 12 obtained by actual measurements or inspections are often referred to as the "quality control data" herein. These actual result data 11 and quality control data 12 are stored in the storage means 13. The management condition registration-and-processing means 2 stores management conditions 21 for each lot, in a storage means 22, the management conditions including a fabrication method of fabricating each lot. In addition, the management conditions 21 include a decision method, an upper threshold value, a lower threshold value, and a processing method adopted when an abnormality occurs. The trend decision-and-processing means 3 receives the quality control data 12 from the quality control data registration-and-processing means 1 and statistically processes the data to obtain necessary statistical process control (SPC) data. Also, the trend decision-and-processing means 3 constantly monitors variations of the quality control data 12 and the SPC data. The trend decision-and-processing means 3 constitutes a quality characteristic abnormality decision means, receives information about an abnormality decision method for each lot from the management condition registration-and-processing means 2, makes a decision as to whether the quality characteristics of each lot are at fault by the decision method, and stores the results of decision 31 in a storage means 32. The notice-and-display processing means 4 sends the results of decision 31 made by the trend decision-and-processing means 3 to a person in charge of the fabrication equipment or to an associated plant section having a person in charge of lot management.

A semiconductor production line has inspection stations at various locations to perform inspection steps on quality characteristics of products associated with results of processing performed by an arbitrary fabrication step or fabrication apparatus. Quality control data 12 obtained by inspection steps and the actual result data 11 including data about lot numbers, process step names, product types, and date of completion are collected by the quality control data registration-and-processing means 1 and stored in memory. Then, necessary statistical processing is performed to derived statistical data (SPC data). In this way, SPC data such as the average value of measured values, standard deviation, maximum value, or minimum value are derived. The quality characteristics of the products are evaluated and managed by constantly monitoring variations of these SPC data in the same way as the prior art method. Therefore, description of these evaluating and managing steps is omitted in the description of the present embodiment.

In the present embodiment, the absolute values of the differences between same kinds of the quality control data obtained at given measurement points regarding each of the lots or the absolute values of the differences between same items of SPC data of the same kind derived from the two groups of the series of lots processed by the fabricating step in succession for detecting a trend (which may hereinafter be referred to as the quality control trend) in quality characteristics of products or fluctuations of quality characteristics (which may hereinafter be referred to as the quality control fluctuations). For example, the value of difference between same kinds of the quality control data is the value of difference between maximum and minimum values of the quality control data obtained at each of plural measurement points within the same lot or within the same wafer. As an example of the value of difference between same items of SPC data, the difference between the average values of measured values about quality control data derived from two groups of lots processed in succession by the same fabricating step or by the same fabrication apparatus is used. The absolute value of the difference between same kinds of the quality control data and the absolute value of the difference between same items of SPC data are managed, based on a threshold value previously set by the management condition registration-and-processing means 2. If any one of values of differences exceeds the threshold value, an alarm is issued. The notice-and-display processing means 4 gives a notice to a person in charge of the fabrication equipment or to an associated plant section having a person in charge of lot management.

Figure 2:
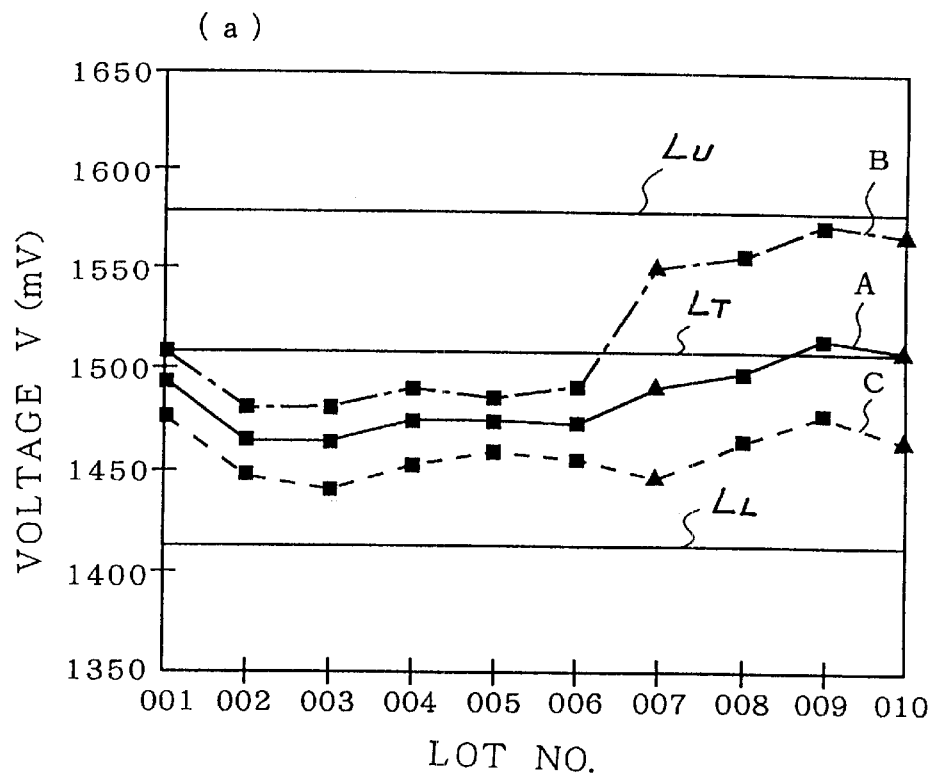
FIG. 2 is a diagram illustrating a quality control trend management method using differential data in accordance with Embodiment 1.
Figure 2:
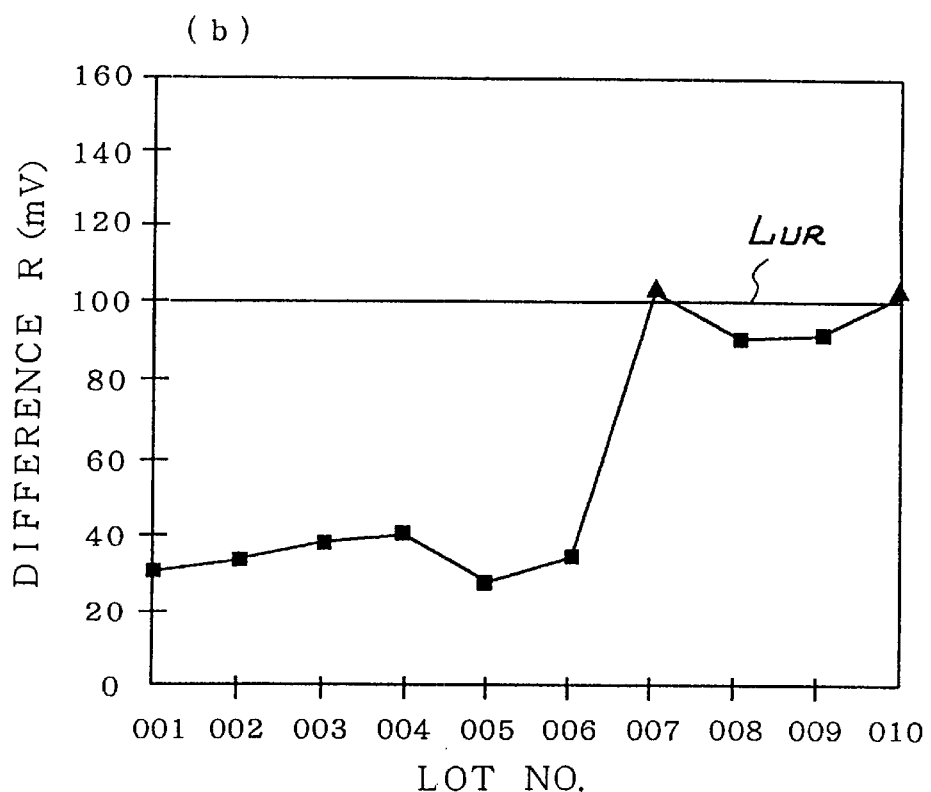

A quality control trend management method using differential data in a semiconductor production line is next described in detail. First, an example in which the value of difference between maximum and minimum values of same kinds of the quality control data at each of plural measurement points within the same lot is used as the difference between the quality control data is described by referring to FIGS. 2(*a*) and 2(*b*). FIG. 2(*a*) is a diagram showing data obtained by measuring given voltages across given portions of wafers in each lot passed through an etching station, as one kind of the quality control data. The horizontal axis indicates the lot number (lot No.), while the vertical axis indicates voltage V (mV). A reference symbol A indicates the transition of the center value within each lot. A reference symbol B indicates the transition of a maximum value within each lot. A reference symbol C indicates the transition of a minimum value within each lot. In this graph, the top line $L_U$ parallel to the horizontal axis shows the threshold upper limit of the center value A. The middle line $L_T$ indicates a target value. The lowest line $L_L$ indicates the threshold lower limit of the center value A. FIG. 2(*b*) is a diagram showing the difference R (mV) between maximum value B and minimum value C at measurement points within the same lot corresponding to the lot treated in FIG. 2(*a*). The threshold upper limit $L_{UR}$ of the difference R is 100 mV. In FIG. 2(*a*), the center value A of lot No. 007 and the center value A of lot No. 010 are within the upper limit $L_U$ and lower limit $L_L$ of a controlled value and so they are not regarded as abnormal in the prior art method. Therefore, no alarm is issued. In the present embodiment, however, the difference R between the maximum and minimum values at each of lot Nos. 007 and 010 is in excess of the threshold upper limit $L_{UR}$ as shown in FIG. 2(*b*) and thus an alarm is issued. Therefore, a notice is given to the associated section, where appropriate means are taken. In FIGS. 2(a) and 2(b), small black squares indicate data items that do not issue an alarm. Small black triangles indicate data items that issue an alarm.

Figure 3:
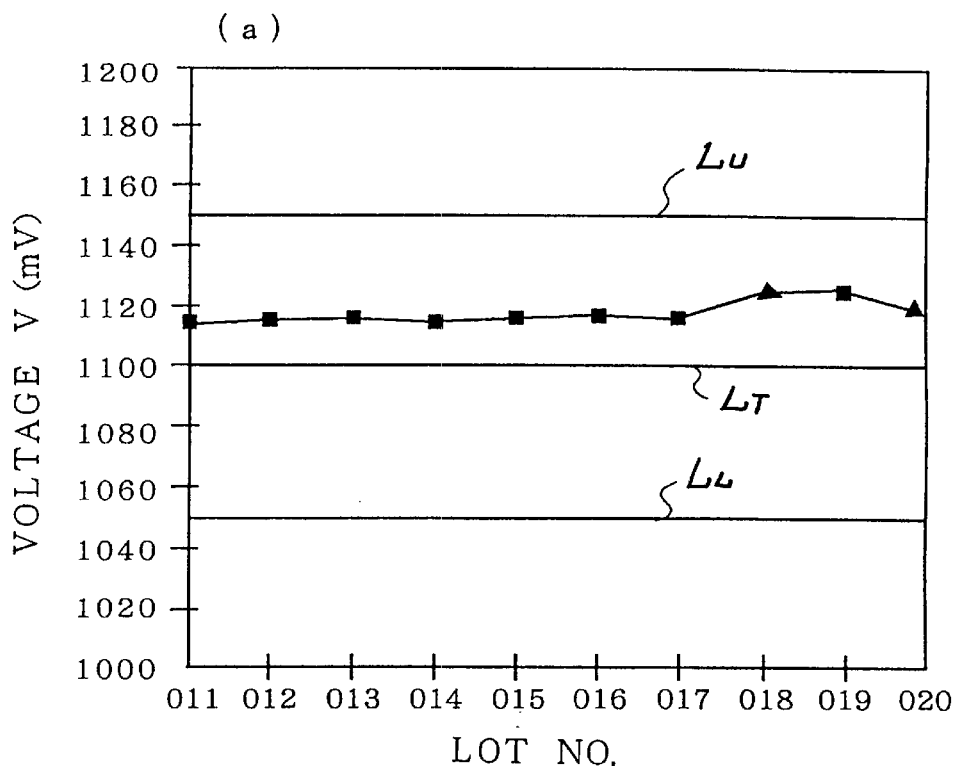
FIG. 3 is a diagram illustrating a quality control trend management method using differential data in accordance with Embodiment 1.
Figure 3:
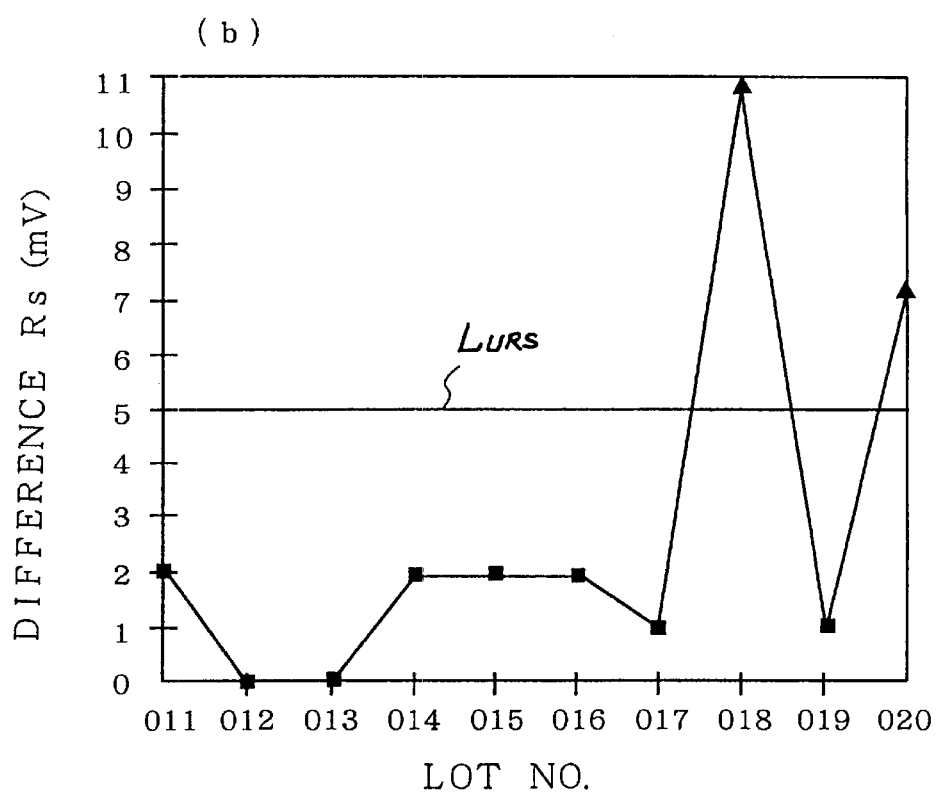
Figure 4:
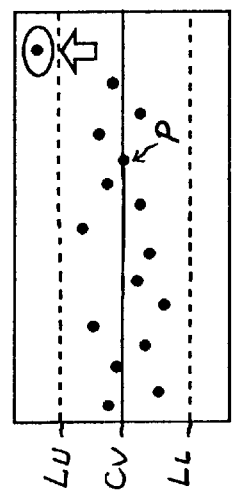
FIG. 4 is a diagram illustrating patterns used by the prior art quality control method to judge abnormality.
Figure 4:
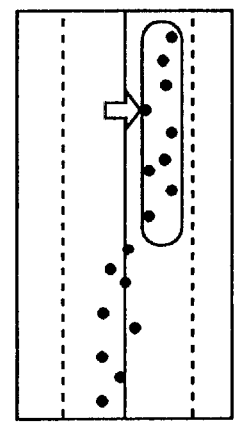
Figure 4:
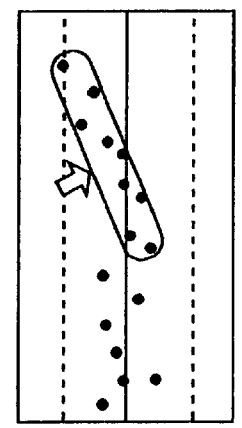
Figure 5:
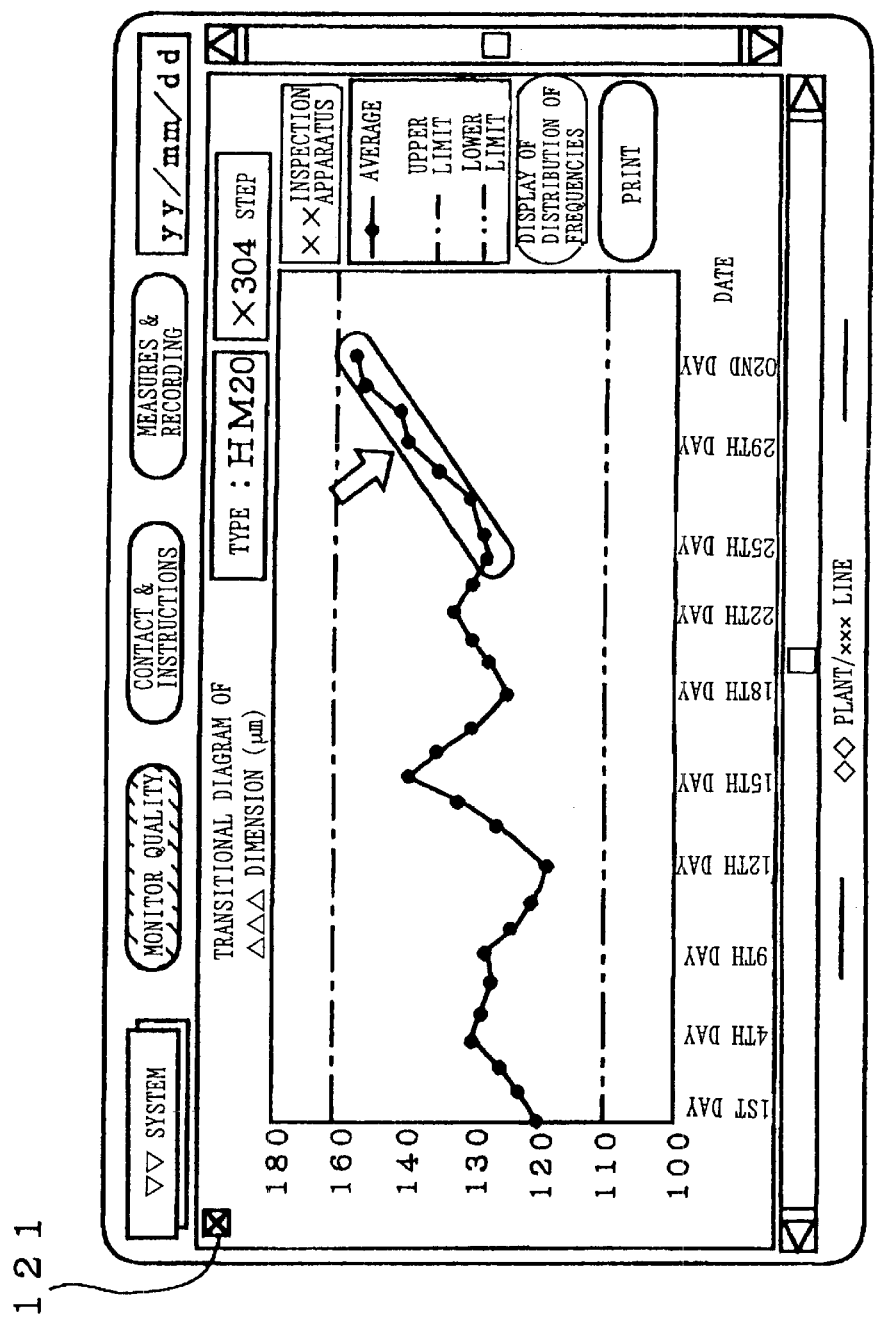
FIG. 5 is a diagram illustrating the transition of the average value of measured dimensions judged to be abnormal by the prior art quality control method.

An example in which the difference between the average values of statistical values about quality control data derived from the two groups of the series of lots processed in succession by the same fabricating step or by the same fabrication apparatus is used as the difference between same items of SPC data is next described, by referring to FIG. 3 (a) and (b). For example, the one group of said two groups consists of the series of lots 011 to 020. The another group consists of the series of lots 001 to 010 and are previously processed to said one group. FIG. 3(a) is a diagram showing the average value of measured voltage values across given portions of wafers in each lot of said one group of the series of lots 011 to 020 passed through an etching station. The horizontal axis indicates lot number (lot No.) of each lot of one group of series of lots, while the vertical axis indicates the voltage V (mV) as one item of the SPC data. In the same way as in FIG. 2(a), the top line $L_U$ parallel to the horizontal axis shows the threshold upper limit of the average value of measured values. The middle line $L_T$ indicates a target value. The lowest line $L_L$ indicates the threshold lower limit of the average value of measured values. FIG. 3(b) is a diagram showing the differences Rs (mV) between the average values of measured values of the each of said one group of series of lots 011 to 020 (shown in FIG. 3(a)) and the average values of measured values of the each lot of said another group of series of lots by 001 to 010. As indicated by the top line $L_{URS}$, the threshold upper limit of the difference Rs is 5 mV. In FIG. 3(a), the average values of the measured values about lot Nos. 018 and 020 are within the upper and lower limits of the threshold values and, therefore, they are not regarded as abnormal in the prior art method. Hence, no alarm is issued. In the present embodiment, however, the differences Rs between the average measured value derived from lot No. 018 and lot No. 020 of said one group, and the average measured value derived from lot No. 008 and lot No. 010 are in excess of the upper limit of the threshold value $L_{URS}$ as shown in FIG. 3(b) and so an alarm is issued. A notice is given to the associated plant section, where appropriate measures are taken. In FIGS. 3(a) and 3(b), too, small black squares indicate data items that produce no alarm. Small black triangles indicate data items that issue an alarm.

The degree of urgency of any controlled item can be preset. Any desired notification means such as a pager or E-mailing can be selected according to the level of urgency.

As described thus far, the quality control trend management system in accordance with the present embodiment can solve the problems with the prior art quality control system. That is, in the above-described conventional quality control method using SPC data, an alarm is issued just when the average value of measured values of each lot exceeds the upper limit or the lower limit of the controlled value. Then, the apparatus or lot is stopped. Therefore, many lots have been already made defective. The stoppage of the apparatus or lot gives rise to a decrease in the productivity. In the quality control trend management system in accordance with the present embodiment, a trend in quality control characteristics of products or fluctuations of the quality control characteristics are detected in an early stage by using the absolute values of the differences between same kinds of the data obtained at given measurement points regarding each of the fabricating products about the quality control data or between same items of SPC data derived by same fabricating step in succession. Then, measures can be taken in an early stage. Consequently, troubles with quality can be prevented.

What is claimed is:

1. A quality control method for a production line including at least one fabricating step for fabricating products including plural groups of a series of lots, said quality control method comprising:

inspecting products being fabrication in association with results of fabrication steps and collecting inspection data from the inspecting;

storing the inspection data obtained in a memory;

statistically processing the inspection data stored in the memory to derive statistical data; and managing variations in the statistical data to manage quality characteristics of the products being fabricated, wherein a trend in quality is managed using absolute values of differences between the statistical data derived from the two groups of the series of lots processed in succession.

2. The quality control method as set forth in claim 1, wherein the trend in quality is managed using the values of differences between average values derived from the two groups of the series of lots processed in succession.

3. The quality control method as set forth in claim 1, wherein the trend in quality is managed using absolute values of differences between corresponding items of the statistical data derived from the two groups of the series of lots processed in succession, based on a threshold value and, if any one of the values of differences exceeds the threshold value, issuing an alarm.

* * * * *